United States Patent [19]

Aschwanden

[11] 4,182,994
[45] Jan. 8, 1980

[54] PHASE LOCKED LOOP TUNING SYSTEM INCLUDING STABILIZED TIME INTERVAL CONTROL CIRCUIT

[75] Inventor: Felix Aschwanden, Thalwil, Switzerland

[73] Assignee: RCA Corporation, New York, N.Y.

[21] Appl. No.: 925,655

[22] Filed: Jul. 17, 1978

[30] Foreign Application Priority Data

Aug. 22, 1977 [GB] United Kingdom ............... 35167/77

[51] Int. Cl.² .............................................. H03B 3/04
[52] U.S. Cl. ................................... 331/1 A; 325/419; 325/453; 325/468; 331/25
[58] Field of Search .................... 331/1 A, 18, 25; 325/453, 459, 464, 465, 468, 419–421; 358/191

[56] References Cited

U.S. PATENT DOCUMENTS 4,097,810  6/1978  Aschwanden ...................... 325/453

OTHER PUBLICATIONS

Schmid et al., Electronic Design, No. 26, Dec. 19, 1968, pp. 61–65.
Schmid et al., Electronic Design, No. 1, Jan. 4, 1969, pp. 104–108.

Primary Examiner—Siegfried H. Grimm
Attorney, Agent, or Firm—Eugene M. Whitacre; Paul J. Rasmussen; Peter M. Emanuel

[57] ABSTRACT

A phase locked loop (PLL) tuning system for generating a local oscillator signal includes a programmable divider having a programmable division factor related to the frequency of the local oscillator signal. The programmable factor is determined by the duration of output pulses generated by a triggerable circuit in response to input trigger pulses generated by the PLL. The duration of the output pulses is adjustable by means of a potentiometer included in an R-C time constant network associated with the triggerable circuit. A reference divider associated with the PLL generates reference trigger pulses and reference time pulses in a substantially fixed time relationship during time intervals between output pulses generated in response to the input trigger pulses. The triggerable circuit generates comparison output pulses in response to the reference trigger pulses. The fixed time interval is related to the nominal values of the durations of the comparison output pulses. A comparison circuit generates a control signal in accordance with the time relationship between the termination of the comparison output pulses and the reference time pulses. The control signal is coupled to the time constant network to reduce deviations between the duration of the comparison output pulses and the fixed time relationship.

9 Claims, 4 Drawing Figures

PHASE LOCKED LOOP TUNING SYSTEM INCLUDING STABILIZED TIME INTERVAL CONTROL CIRCUIT

ENVIRONMENT OF THE PRESENT INVENTION

The present invention pertains to the field of apparatus for controlling timing intervals.

A variety of control applications employ apparatus such as a monostable multivibrator for generating a signal having a duration determined by the time constant of a resistor capacitor (R-C) network. For example, in U.S. Pat. No. 4,097,810 issued June 27, 1978 in the name of the same inventor as the present inventor, there is described a phase locked loop (PLL) tuner control system for generating a local oscillator signal including a frequency divider having a programmable division factor related to the frequency of the local oscillator signal controlled by the adjustment of a potentiometer included in an R-C time constant network associated with a monostable multivibrator.

Such a tuner control system is desirable because it provides a user interface similar to that of conventional mechanical tuner control apparatus, but which is inherently more reliable. In addition, such a tuner control system is presettable to preferred stations and maintains tuning information for the last selected station in the absence of power without additional apparatus such as a nonvolatile memory or standby power supply typically employed with digital tuner control systems having comparable features.

Unfortunately, the stability of systems employing analog time interval control apparatus is limited by environmental conditions such as temperature, power supply variations and component aging. In tuning control systems of the type described above, inadequate stability of the time interval control apparatus may cause the frequency of the local oscillator signal for one station to jump to the frequency of the local oscillator signal for an adjacent station. Therefore, there is a need for time interval control apparatus which has the aforementioned advantages but which is significantly more stable than conventional analog time interval control apparatus.

SUMMARY OF THE PRESENT INVENTION

In a control apparatus such as one for adjustably controlling the duration of a counting interval of a programmable divider in a PLL tuning system, triggerable means generates output pulses in response to trigger pulses. Time constant means associated with the triggerable means controls the duration of the output pulses. The triggerable means generates normal output pulses for use by controllable utilization means in response to normal input pulses. Reference means generates reference trigger and time pulses in a substantially fixed time relationship during a time interval between the normal output pulses. The triggerable means generates comparison output pulses in response to the reference trigger pulses. The time relationship between the reference trigger pulses and the reference time pulses is related to the nominal value of the duration of the comparison pulses. Comparison means generates an error signal in response to the time relationship between the comparison output pulses and the reference time pulse to reduce deviations between the duration of the comparison output pulses and the fixed time interval.

DETAILED DESCRIPTION OF THE DRAWING

Figure 1:
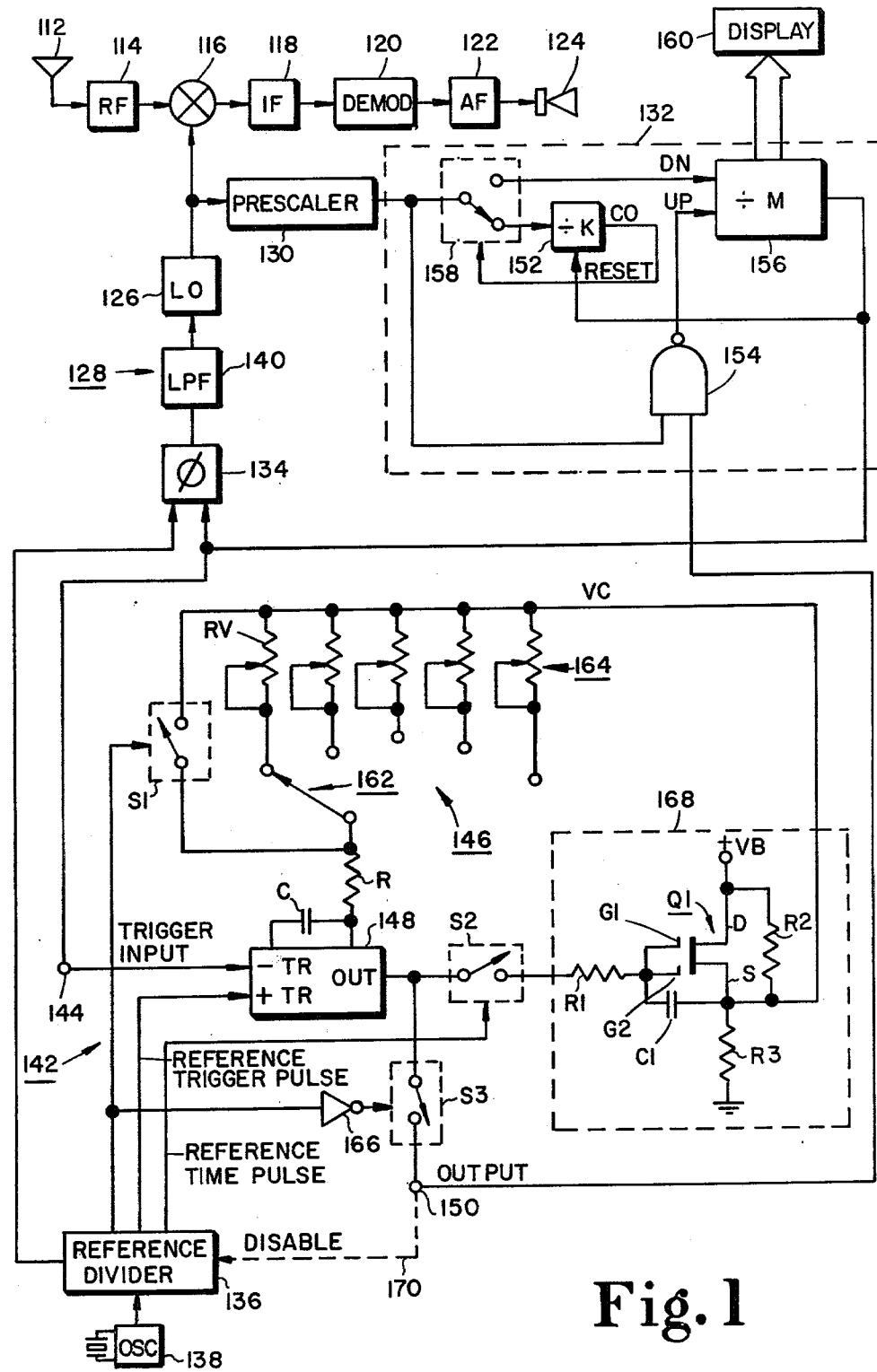
FIG. 1 shows, partially in block diagram form and partially in schematic form, an embodiment of the present invention employed in a tuner of a radio receiver.

In the radio receiver of FIG. 1, an antenna 112 receives RF carriers bearing audio information. The RF carriers are filtered and amplified in an RF processing unit 114. A mixer 116 combines the processed RF carriers with a local oscillator signal, having the appropriate frequency for tuning the selected station, to produce an IF signal. The IF signal is filtered and amplified in an IF processing unit 118. The processed IF signal is demodulated in a demodulator 120 to produce audio frequency (AF) signals. The AF signals are processed in an AF processing unit 122 and coupled to a speaker 124.

The local oscillator signal is generated by a local oscillator (LO) 126 in response to a control signal generated by a phase locked loop (PLL) tuning system 128. PLL tuning system 128 includes a prescaler 130 for dividing the frequency of the local oscillator by a factor S selected so that the frequency of its output signal is compatible with the frequency limitations of a programmable divider 132 to which it is coupled. Programmable divider 132 divides the frequency of the output signal of prescaler 130 by a controllable factor N determined by the station selected by a user. The output signal of programmable divider 132 is coupled to one input of a phase ($\phi$) comparator 134. A reference frequency signal, generated by a reference divider in response to the output signal of a crystal oscillator 138, is coupled to the other input of phase comparator 134. Phase comparator 134 generates an output signal representing the phase and/or frequency deviation between its two input signals. The output signal of phase comparator 134 is filtered by a low pass filter 140 to derive the control voltage for local oscillator 126.

The frequency of the local oscillator signal is adjusted in response to the control signal until the phase and frequency deviation between the two input signals of phase comparator 134 is negligible. At this point, the frequency of the local oscillator signal, $f_{LO}$, is related to the frequency of the reference frequency signal, $f_{REF}$, by the following expression:

$$f_{LO} = SNf_{REF} \qquad (1)$$

Thus if, for example, it is desired to tune European FM broadcast stations having local oscillator frequencies at 100 KHz intervals between 98 and 115.2 KHz, suitable selections of S, N and $f_{REF}$ are:

$f_{REF} = 1$ KHz $S = 100$

N = 980 to 1152

The factor N is controlled by a time interval control unit 142 in accordance with the station selected by a user. Specifically, at the beginning of each divide by N cycle, an output pulse of programmable divider 132, generated at the end of the previous divide by N cycle, is coupled to a trigger input terminal 144 of time interval control unit 142. In response, a positive-going pulse, having a duration adjusted by a user for the selected station by means of an adjustable time constant circuit 146 associated with a monostable multivibrator (MSMV) 148, is generated at an output terminal 150 of time interval control unit 142. The output pulse generated at the output of programmable divider 132 at the end of the previous divide by N cycle also causes a fixed modulus counter 152 to be reset to a count of zero.

The output pulse of time interval control unit 142 enables a NAND gate 154 to couple output pulses of prescaler 130 to an UP counting input of an UP/-DOWN counter 156. At the same time, output pulses of prescaler 130 are coupled to an input switch 158 to the clock input of counter 152. Since the termination of the output pulse of time interval control unit 142 causes NAND gate 154 to be disabled, counter 156 counts to a number M determined by the duration of the output pulses of time interval control unit 142. However, counter 152 continues to count until a count of K (K being greater than M) is reached. When the count of K is reached, counter 152 generates a carryout (CO) signal which causes input switch 158 to decouple the output pulses of prescaler 130 from the clock input of counter 152 and to be coupled to the down (DN) counting input of counter 156. When counter 156 reaches a count of zero M counts later, it generates an output pulse which initiates the next divide by N cycle. In addition, during the portion of the divide by N cycle in which counter 156 is not counting, the contents of counter 156 are coupled to a display unit 160 which in response generates a display to identify the selected station.

Thus, during each divide by N cycle, $$N = K + M \quad (2)$$

output pulses of prescaler 130 are counted by programmable counter 132. Suitable selections of K and M so that N has the range of values set forth appropriate for tuning European FM broadcast stations are:

K = 979

M = 1 to 172

As earlier mentioned, the duration of the output pulse of time interval control unit 142 is determined by time constant network 146 in association with MSMV 148. Time constant network 146 includes a resistive part comprising the series connection of a resistor R and a potentiometer RV selected by means of a station selector switch 162 from a group of potentiometers 164 and a capacitive part comprising a capacitor C. Each of the potentiometers in group 164 are adjusted to determine the value of M for a respective station. MSMV 148 may comprise any one of a number of commercially available integrated circuits such as a CD4098 available from RCA Corporation.

Conventionally, the time constant network associated with an MSMV is coupled between a supply voltage and appropriate time constant terminals of the MSMV. In such a conventional arrangement, the time duration, $t_D$, of the output pulse is given by $$t_D = (RV + R)C \cdot k \quad (3)$$

where k is a factor depending on the active circuitry within the MSMV and the supply voltage. Time duration $t_D$ is minimum when RV is adjusted to have a minimum resistance value and maximum when RV is adjusted to have a maximum resistance value. The stability of $t_D$ depends on the stability of RV, R, C and k and is therefore subject to variations due to such factors as temperature, power supply variations and component aging. It is possible to some degree to control the stability of $t_D$ by suitable selection of components. However, even with such precautions, the stability of $t_D$ associated with conventional time interval control arrangements may not be acceptable for some applications. For example, in the tuning system shown in FIG. 1, undesirable variations of $t_D$ may cause M to increase or decrease thereby causing a station other than the selected station to be tuned.

Time interval control unit 148 is arranged to substantially eliminate variations of $t_D$ caused by variations of R, C, and K. Basically, to accomplish this, a reference trigger pulse derived by reference divider 136 is utilized to trigger MSMV 148 during an inactive time interval between its output pulses normally coupled to the control portion of programmable divider 132 and the duration of the resultant output pulses is compared with the occurrence of a reference time pulse also generated by reference divider 136 to generate a control voltage which is coupled to time constant network 146 to stabilize the duration of the output pulses of MSMV 148. The time relationship between the reference trigger pulse and the reference time pulse is relatively stable since it is determined by the stability of crystal oscillator 138 and is selected to be equal to the nominal value of the minimum time duration of the output pulses, i.e., the time duration when RV is shorted. Accordingly, potentiometer RV, i.e., the adjustable portion of time constant network, is short circuited during the comparison time interval. This latter provision removes the effect of potentiometer RV on $t_D$ and therefore permits the use of the same reference time pulse regardless of the value of potentiometer RV.

Figure 2:
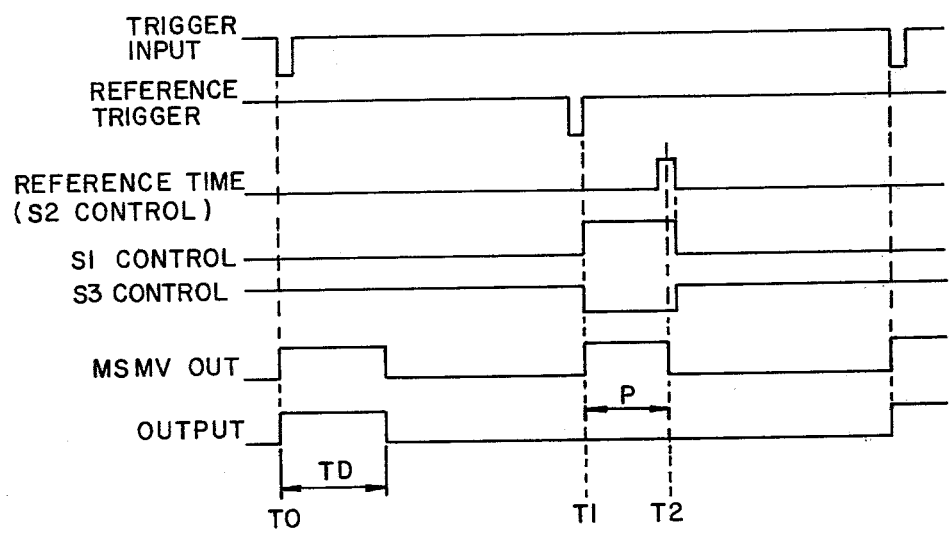
FIG. 2 shows graphical representations of waveforms useful in facilitating an understanding of the operation of the embodiment of the present invention shown in FIG. 1.

Specifically, with reference to the waveforms of FIG. 2, at a time T0, in response to the negative-going edge of an output pulse of programmable divider 132 coupled to a negative-going trigger (−TR) input of MSMV 148, a positive-going pulse is generated at the output (OUT) of MSMV 148. At this time, a switch S1, coupled across RV, is opened and a switch S3, coupled between the output of MSMV 148 and output terminal 150, is closed in response to the relatively high level of a switch control signal generated by reference divider 136 and directly coupled to the control input of switch S1 and coupled to the control input of switch S3 through an inverter 166. Consequently, this first output pulse, hereinafter referred to as the normal output pulse, has a time duration determined by RV, R, C and k according to expression (3) and is coupled to the control portion of programmable divider 132.

At a time T1, in response to a positive-going reference trigger pulse generated by reference divider 136 and coupled to a positive-going trigger (+TR) input of MSMV 148, a second positive-going output pulse, hereinafter referred to as the comparison output pulse, is generated at the output of MSMV 148. At the same time, in response to the relatively low level of the switch control signal generated by reference divider 136, switch S1 is closed and switch S3 is opened. The closure of switch S1 shorts out potentiometer RV so that the time duration, P, of the comparison output pulse of MSMV 148 is given by $$P = RCk \qquad (4)$$

and is therefore not dependent on the value of potentiometer RV. Switch S3 is opended so that the comparison output pulse is not coupled to the control portion of programmable divider 132.

At a predetermined time after the generation of the reference trigger pulse, a positive-going reference time pulse is generated by reference divider 136 and coupled to the control input of a switch S2. The predetermined time is selected so that the time interval between T1 and a time T2, about which the reference time pulse is substantially symmetrical, is substantially equal to the nominal value of the time duration, P, of the comparison output pulse of MSMV 148. Switch S2 closes in response to the time reference pulse and therefore serves as a phase or coincidence detector. The level of the output signal of switch S2 during the reference time pulse represents the deviation between the time of occurrence of the termination, i.e., the negative-going edge, of the comparison output pulse and time T2. In response to the output signal of switch S2, a control voltage network 168 generates a control voltage VC which is coupled to time constant network 146 at the commonly connected ends of the potentiometers of group 164 to correct for the deviation. Thereafter, in response to the termination of the reference time pulse, switch S1 is opened and switch S3 is closed so that the next normal output of MSMV 148 has its duration controlled in accordance with the value of RV and is coupled to the control portion of programmable divider 132.

Control voltage network 168 includes a low pass filter comprising a resistor R1 and a capacitor C1 and a follower type amplifier comprising an N-channel field effect transistor (FET) Q1 and resistors R2 and R3. The control voltage developed at the source (S) of FET Q1 is a portion of the supply voltage VB of the amplifier determined by the values of resistors R2 and R3 and the conduction of FET Q1 between its drain (D) and source. If the comparison output pulse of MSMV 148 terminates after the reference time pulse, during the reference time pulse a relatively high level voltage (equal to the voltage level of the output pulse of MSMV 148) is coupled to the low pass filter causing a charging current to flow through capacitor C1 between the commonly connected gates of FET Q1, G1 and G2, and the source of FET Q1. In response, the voltage between the commonly connected gates of FET Q1 and the source of FET Q1 increases. Accordingly, the conduction between the drain and source of FET Q1 increases thereby causing the control voltage to increase. Increasing the voltage coupled to time constant network 146 has the same effect as decreasing the value of RV. As a result, the time duration of the next normal output pulse, after the correction interval, is decreased.

If the comparison output pulse of MSMV 148 terminates before the time reference pulse, during the time reference pulse a relatively low level voltage is coupled to the low pass filter causing a discharging current to flow through capacitor C1 between the source of FET Q1 and the gates of FET Q1. In response, the voltage between the commonly connected gates of FET Q1 and the source of FET Q1 decreases. Accordingly, the conduction of FET Q1 between its drain and source decreases thereby causing the control voltage to decrease. Since decreasing the voltage coupled to time constant network 146 corresponds to increasing the value of RV, the time duration of the next normal output pulse after the comparison pulse is increased.

If the comparison output pulse terminates during the time reference pulse, during the time reference pulse the relatively high level voltage and the relatively low level voltage are sequentially coupled to the low pass filter. Therefore, if the comparison output pulse terminates at time T2, during the duration of the time reference pulse, equal magnitude charging and discharging currents sequentially flow through C1 and the control voltage remains substantially unchanged. Since the time constant associated with the operation of control voltage network 168 is considerably longer than the acquisition time of PLL 128, several divide by N cycles are usually required, depending on the degree of deviation, before the termination of the comparison output pulse is made to coincide with T2.

When time interval control unit 142 is employed in a closed loop system such as PLL 128 wherein the reference frequency signal is generated by the same source, e.g., reference divider 136, as the trigger reference and time reference signals, and is normally triggered in response to a signal, e.g., the output signal of programmable divider 132, made synchronous with respect to the reference frequency signal by the operation of the system, the reference trigger signal and reference time signal are automatically in the proper time relationship with the normal trigger input signals so that the comparison output pulses do not interfere with the normal output pulses (providing also that the time interval between the reference trigger pulses and the reference time pulses is shorter than the duration between successive normal output pulses). However, in applications where the normal trigger input pulses are not synchronously related to the reference trigger and reference time pulses, it is desirable to synchronize the generation of the reference trigger and reference time pulse with respect to the normal output pulses by, for example, disabling their source during the duration of normal output pulses as is indicated in FIG. 1 by the phantom connection labelled "DISABLE" between output terminal 150 and reference divider 136.

Figure 3:
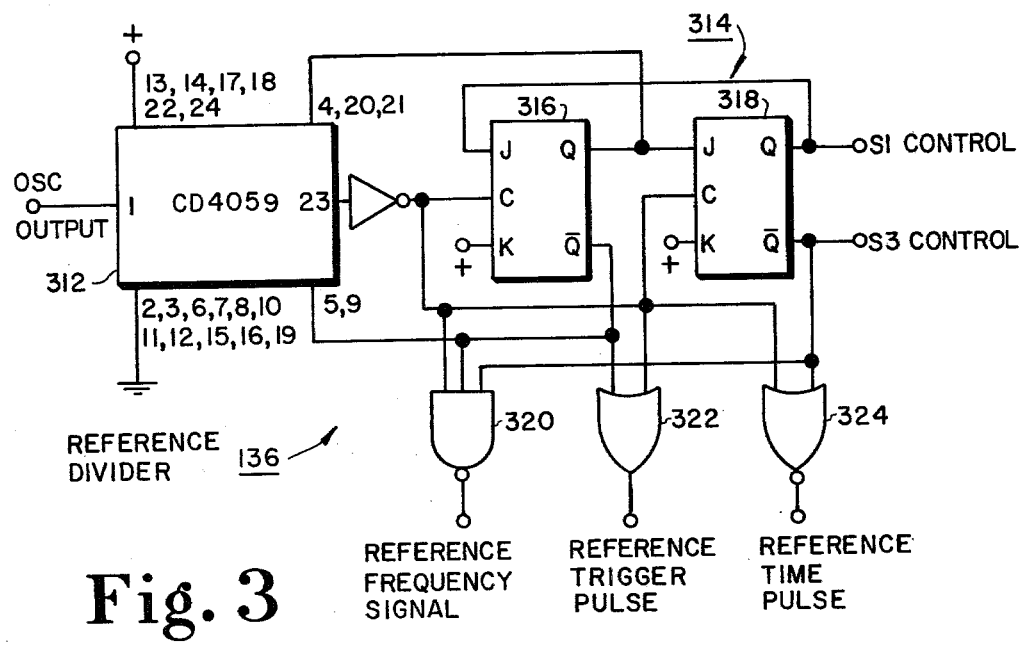
FIG. 3 shows, in logic diagram form, an implementation of a portion of the embodiment of the present invention shown in FIG. 1.

The implementation of reference divider 136 shown in FIG. 3 includes a programmable counter 312, such as a CD4059A integrated circuit commercially available from RCA Corporation, connected as shown, a divide by 3 divider including two J-K flip-flops with set-reset inputs 316 and 318, which may comprise a CD4027 integrated circuit also commercially available from RCA Corporation, a NAND gate 320, an OR gate 322 and a NOR gate 324. Divide by 3 divider controls the factor by which programmable counter 312 divides the output signal of oscillator 138 of PLL 128 shown in FIG. 1. Gates 320, 322 and 324 detect the occurrence of specific counts to generate at their respective outputs the reference frequency signal, the reference trigger pulse and the reference time pulse. The control signals for S1 and S3 are generated at the Q and $\overline{Q}$ outputs of flip-flop 318.

Programmable counter 312 divides by a factor of 2314 between the generation of a reference frequency pulse and the generation of the next reference trigger pulse. Accordingly, OR gate 322 generates one negative-going reference trigger pulse for every 2314 output pulses of oscillator 138 of PLL 128 shown in FIG. 1. Programmable counter 312 divides by 372 between the generation of a reference trigger pulse and the generation of the next reference time pulse. Accordingly, NOR gate 324 generates one positive-going reference time pulse for every 2686 (i.e., 2314+372) output pulses of oscillator 138. Programmable counter 312 divides by a factor of 2314 between the generation of a reference time pulse and the generation of the next reference frequency pulse. Accordingly, NAND gate 320 generates one negative-going reference frequency pulse for every 5,000 (i.e., 2314+372+2314) output pulses of oscillator 138.

While time interval control unit 142 shown in FIG. 1 is arranged to stabilize the minimum time duration of the output pulse generated by MSMV 148 by shorting potentiometer RV during the comparison interval and comparing the duration of the resulting comparison output pulse with a corresponding time reference pulse, it is possible to stabilize the maximum time duration of the output pulse generated by MSMV 148 by opening the wiper lead of potentiometer RV during the comparison time interval and comparing the duration of the resulting comparison output pulse with another corresponding time reference pulse. This latter arrangement would be advantageous if it were desired to compensate for tolerance changes in potentiometer RV due to temperature and the like. Moreover, it is possible to stabilize both the maximum and the minimum time durations of the output pulse of MSMV 148 by generating a first control voltage during a comparison interval in which potentiometer RV is shorted and a second control voltage during a comparison interval in which the wiper arm of potentiometer RV is opened. In this arrangement, the two control voltages are to be coupled across potentiometer RV and the wiper arm of potentiometer RV is to be coupled through a voltage to current converter to a timing capacitor associated with the MSMV. Such an arrangement is somewhat more complex than the one shown in FIG. 1 since it requires two control voltages with logic for generating two reference time pulses and additional switches.

Figure 4:
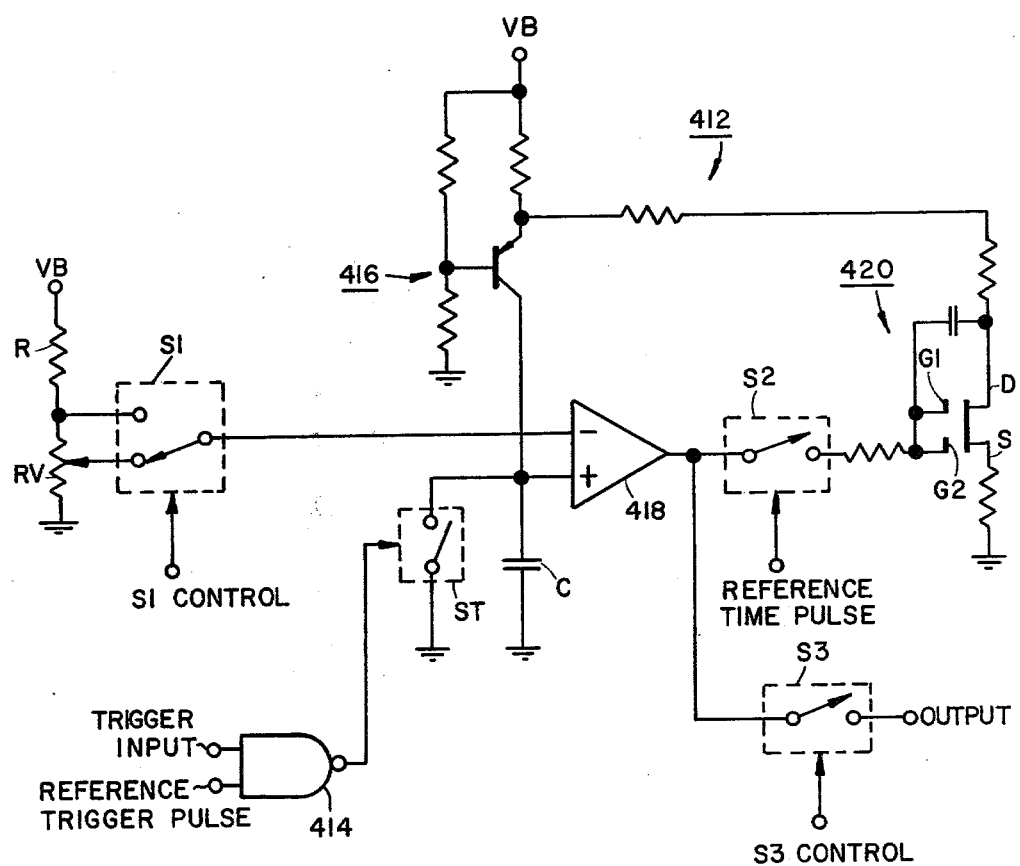
FIG. 4 shows, in schematic form, another embodiment of the present invention.

Time interval control circuit 412 shown in FIG. 4 is another time interval control circuit which may be employed in applications such as PLL 128 shown in FIG. 1 and may have an advantage over the time interval control unit 142 shown in FIG. 1 because it does not require the stabilization of the minimum time duration of its output pulse. The same reference and switch control signals utilized in time interval control unit 142 shown in FIG. 1 may be employed in time interval control unit 412. In time interval control unit 412, a negative-going trigger input pulse is inverted by a NAND gate 414 and coupled to the control input of a switch ST. Switch ST remains closed during the trigger input signal and thereby discharges a capacitor C across which it is coupled. After the termination of the trigger input signal, switch ST opens allowing a current generated by a constant current source 416 to charge capacitor C. The voltage developed across capacitor C increases linearly. the linearly increasing voltage developed across capacitor C is coupled to the noninverting (+) input of a voltage comparator 418, which may for example, comprise a CA3130 integrated circuit commercially available from RCA Corporation. The inverting (−) input of voltage comparator 418 is coupled to the wiper of a potentiometer RV coupled in series with a resistor R between a supply voltage VB and ground.

When the linearly increasing voltage developed across capacitor C reaches the voltage developed at the wiper of potentiometer RV, the output of the voltage comparator 418 switches from a low level to a high level. The duration of the low level thus extends from the negative-going edge of the trigger input pulse to the time at which the linearly increasing voltage developed across capacitor C substantially equals the voltage developed at the wiper of potentiometer RV. The maximum time duration of the low level output pulse of voltage comparator 418 corresponds to the maximum value of resistance between the wiper of potentiometer RV and ground. The minimum time duration corresponds to the minimum value of resistance between the wiper of potentiometer RV and ground, i.e., 0, and is therefore substantially equal to 0. Therefore, the minimum time duration does not need to be stabilized.

To stabilize the maximum time interval, during the comparison interval between normally generated output pulses of time interval control unit 412, a negative-going reference trigger pulse is coupled to NAND gate 414. In response, a linearly increasing voltage is again developed across capacitor C. At the same time a switch S1 couples the inverting input of voltage comparator 418 to the junction of resistor R and potentiometer RV. As a result, the comparison output pulse generated at time interval control unit 412 in response to the reference trigger pulse has a maximum time duration. If the comparison pulse does not terminate at time T2, corresponding to the time midpoint of a reference time pulse coupled to the control input of a switch S2, a control voltage circuit 420 generates a control voltage to alter the charging current developed by current source 416 to correct for the deviation. A switch S3 is utilized to decouple the comparison output pulse of voltage comparator 418 from an output terminal of time interval control unit 412 during the comparison interval between normal output pulses.

Although switches shown in FIGS. 1 and 4 are shown symbolically as electromechanical switches, it will be appreciated that it is desirable that these switches be semiconductor switches such as those commercially available from RCA Corporations as CD4066 integrated circuit devices. In addition, while the timer interval control circuits which have been described have particular advantages when employed in an application such as a PLL which already includes a stable source of time signals, it will be appreciated that other applications are contemplated to be within the scope of the invention defined by the following claims.

What is claimed is:

1. Apparatus comprising: controlled oscillator means for generating a controlled oscillator signal having a frequency determined by a control signal;
   programmable divider means for dividing the frequency of said controlled oscillator means by a programmable factor N to generate a frequency divided controlled oscillator signal having one pulse for every N cycles of said controlled oscillator signal;
   reference means including a relatively stable oscillator for generating a frequency reference signal;

phase comparator means for generating said control signal in accordance with the phase and frequency relationship between said frequency divided controlled oscillator signal and said frequency reference signal;

triggerable means for generating output pulses in response to input pulses, said triggerable means including time constant means for determining the duration of said output pulses, said triggerable means generating normal output pulses in response to said pulses of frequency divided controlled oscillator signal;

programmable factor control means for controlling said programmable factor N in accordance with the duration of said normal pulses generated by said programmable divider means;

said reference means also generating reference trigger and time reference pulses in a substantially fixed time relationship in the time interval between successive ones of said normal output pulses, said triggerable means generating comparison output pulses having a predetermined duration in response to said reference trigger pulses, said fixed time relationship being related to the nominal value of the predetermined duration of said comparison output pulses; and comparison means for generating an error signal in response to said comparison output pulses and said time reference pulses representing the deviation between the duration of said comparison output pulses and said fixed time relationship, said time constant means being responsive to said error signal to reduce said deviation.

2. The apparatus recited in claim 1 wherein:
said time constant means includes a variable means for determining a controllable portion of the duration of said normal output pulses, and first switch means for selectively disabling said variable means from affecting the duration of said comparison output pulses.

3. The apparatus recited in claim 2 wherein:
said triggerable means includes second switch means for decoupling said comparison output pulses from said programmable factor control means.

4. The apparatus recited in claim 3 wherein:
said triggerable means includes a monostable multivibrator.

5. The apparatus recited in claim 4 wherein:
said time constant means includes variable resistance means coupled to said monostable multivibrator, and said first switch means is coupled in parallel relationship with said variable resistance to shunt said variable resistance means during the duration of said comparison output pulses.

6. The apparatus recited in claim 3 wherein:
said triggerable means includes voltage comparator means having first and second inputs and an output; capacitive means for developing a first voltage at said first input; current source means for coupling a current to said capacitive means, said capacitive means developing said first voltage in response to said current; third switch means for selectively discharging said capacitive means in response to said pulses of said frequency divided controlled oscillator signal; voltage divider means including variable resistance means for developing a second voltage at said second input, said voltage comparator generating an output signal at its output having a first level when said first voltage exceeds said second voltage and having a second level when said second voltage exceeds said first voltage; and said error signal is coupled to said current source means to control said current coupled to said capacitive means.

7. The apparatus recited in claim 6 wherein:
said variable resistance means includes a potentiometer having two ends defining the ends of a resistance path and a wiper for adjusting the resistance between the wiper and said ends, said first switch means coupling said wiper to said second input during the duration of said normal output pulses and coupling one of said ends to said second input during the duration of said comparison output pulses.

8. The apparatus recited in claim 3 wherein:
said comparison means includes low pass filter means and third switch means for selectively coupling said comparison output pulses to said low pass filter means during the duration of said reference time, said low pass filter deriving said error signal.

9. The apparatus recited in claim 3 wherein:
said controlled oscillator means includes a voltage controlled local oscillator.

* * * * *

UNITED STATES PATENT AND TRADEMARK OFFICE
CERTIFICATE OF CORRECTION

PATENT NO. : 4,182,994

DATED : January 8, 1980

INVENTOR(S) : Felix Aschwanden

It is certified that error appears in the above-identified patent and that said Letters Patent is hereby corrected as shown below:

Col. 2, equation (1), "$f_{LO} = SNF_{REF}$" should be $$--f_{LO} = SNf_{REF}--.$$

Col. 5, line 12, "opended" should be --opened--.
Col. 5, line 37, after "output" add --pulse--.
Col. 7, line 66, "the" should be --The--.
Col. 8, line 49, "Corporations" should be --Corporation--.
Col. 8, line 50, "timer" should be --time--.

Signed and Sealed this

Eighth Day of April 1980

[SEAL]

Attest:

SIDNEY A. DIAMOND

Attesting Officer

Commissioner of Patents and Trademarks